United States Patent
Wu et al.

(10) Patent No.: US 7,307,291 B2
(45) Date of Patent: Dec. 11, 2007

(54) GALLIUM-NITRIDE BASED ULTRAVIOLET PHOTO DETECTOR

(75) Inventors: Liang-Wen Wu, Banciao (TW); Ru-Chin Tu, Tainan (TW); Cheng-Tsang Yu, Wufong Township, Taichung County (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 373 days.

(21) Appl. No.: 11/041,491

(22) Filed: Jan. 22, 2005

(65) Prior Publication Data

US 2006/0163681 A1   Jul. 27, 2006

(51) Int. Cl.
*H01L 31/072* (2006.01)
(52) U.S. Cl. .............. 257/184; 257/431; 257/436; 257/E31.021; 257/E31.022; 257/E31.067; 257/E31.091
(58) Field of Classification Search ........... 257/184, 257/185, 428, 436, 427, E31.054, E31.061, 257/E31.067, E31.093, E31.021, E31.022, 257/437, 431
See application file for complete search history.

(56) References Cited

U.S. PATENT DOCUMENTS

| 6,921,928 B2 * | 7/2005 | Sonobe ................. 257/99 |
| 2005/0012113 A1 * | 1/2005 | Sheu et al. .............. 257/184 |

* cited by examiner

*Primary Examiner*—Matthew E. Warren

(57) ABSTRACT

A structure for a gallium-nitride (GaN) based ultraviolet photo detector is provided. The structure contains an n-type contact layer, a light absorption layer, a light penetration layer, and a p-type contact layer, sequentially stacked on a substrate from bottom to top in this order. The layers are all made of aluminum-gallium-indium-nitride (AlGaInN) compound semiconductors. By varying the composition of aluminum, gallium, and indium, the layers, on one hand, can achieve the desired band gaps so that the photo detector is highly responsive to ultraviolet lights having specific wavelengths. On the other hand, the layers have compatible lattice constants so that problems associated with excessive stress are avoided and high-quality epitaxial structure is obtained. The structure further contains a positive electrode, a light penetration contact layer, and an anti-reflective coating layer on top of the p-type contact layer, and a negative electrode on the n-type contact layer.

7 Claims, 5 Drawing Sheets

GALLIUM-NITRIDE BASED ULTRAVIOLET PHOTO DETECTOR

BACKGROUND OF THE INVENTION

1. Field of the Invention

The present invention generally relates to the photo detectors and, more particularly, to the gallium-nitride based ultraviolet photo detectors.

2. The Prior Arts

Currently there are three commonly known approaches to building photo detectors that can convert light signals to electrical signals: photo multipliers (PMTs) based on vacuum tubes; photo detectors made of silicon (Si); and photo detectors made of gallium-nitride (GaN) based compound semiconductors.

Among the three approaches, PMTs have a number of disadvantages such as high production cost, high operation voltage, and the fragility of vacuum tubes. The Si-based photo detectors, on the other hand, are easer to manufacture, less costly in production, and operated with lower voltage. However, despite their rather superior performance in detecting lights with longer wavelengths such as visible lights and infrared lights, Si-based photo detectors are less sensitive to lights with shorter wavelengths such as the ultraviolet (UV) lights. In contrast, photo detectors made of GaN-based compound semiconductors, as the GaN-based materials can possess wider band gaps, are very good at detecting UV lights. In addition, by controlling the GaN-based materials' compositions to alter their band gaps, the GaN-based photo detectors can be made to detect UV lights within a specific range of wavelengths.

FIG. 1 is a response characteristics graph of a GaN-based UV photo detector. As can be seen from FIG. 1, UV photo detectors are especially responsive to UV lights whose wavelengths are between 300 nm and 370 nm; this kind of sensitivity is not available from Si-based photo detectors. Therefore, for applications that require this kind of fast response, GaN-based UV photo detectors are the most appropriate candidates.

One of the major problems to known GaN-based semiconductor devices is that there is often an incompatibility in terms of lattice constants within the GaN-based semiconductor devices' layering structure. Such discrepancies in the lattice structures develop and accumulate excessive stress, causing an inferior epitaxial structure of the GaN-based semiconductor devices and thereby an unsatisfactory device performance. In addition, GaN-based photo detectors, on one hand, should have band gaps wide enough to be responsive to UV lights within a specific range of wavelengths and, on the other hand, GaN-based photo detectors should have narrower band gaps so as to form better ohmic contacts with the photo detectors' electrodes. Moreover, problems such as how to reduce the reflection of UV lights from the surface of the GaN-based UV photo detectors and how to increase the GaN-based UV photo detectors' photoelectric conversion efficiency also need to be addressed, so that GaN-based UV photo detectors can have practical values.

SUMMARY OF THE INVENTION

The present invention provides an epitaxial structure for the GaN-based UV photo detectors so that the limitations and disadvantages from the prior arts can be obviated practically.

The structure of the GaN-based UV photo detectors comprises, on top of an upper side of a substrate, an n-type contact layer, a light absorption layer, a light penetration layer, and a p-type contact layer, sequentially stacked in this order from bottom to top. All these layers are made of aluminum-gallium-indium-nitride ($Al_aGa_bIn_{1-a-b}N$, $0 \leq a,b \leq 1$, $a+b \leq 1$) compound semiconducting materials having specific compositions. By varying the Al, Ga, and In composition within these materials, these layers would have the required band gaps, carrier densities, and carrier mobilities. The GaN-based UV photo detectors therefore can be especially sensitive to UV lights having specific wavelengths. On the other hand, these layers can be developed to have compatible lattice constants, avoid the development and accumulation of excessive stress, and contribute to a superior epitaxial structure of the GaN-based UV photo detectors.

The structure of the GaN-based UV photo detectors further comprises a positive electrode, a light penetration contact layer, and an anti-reflective coating layer, all on top of the p-type contact layer. The structure of the GaN-based UV photo detectors also further comprises a negative electrode on top of the n-type contact layer. The anti-reflective coating layer has a reflectivity less than 30% for UV lights (wavelength less than 365 nm), so that a great portion of lights can enter the GaN-based UV photo detectors through the light penetration contact layer.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

Figure 1:
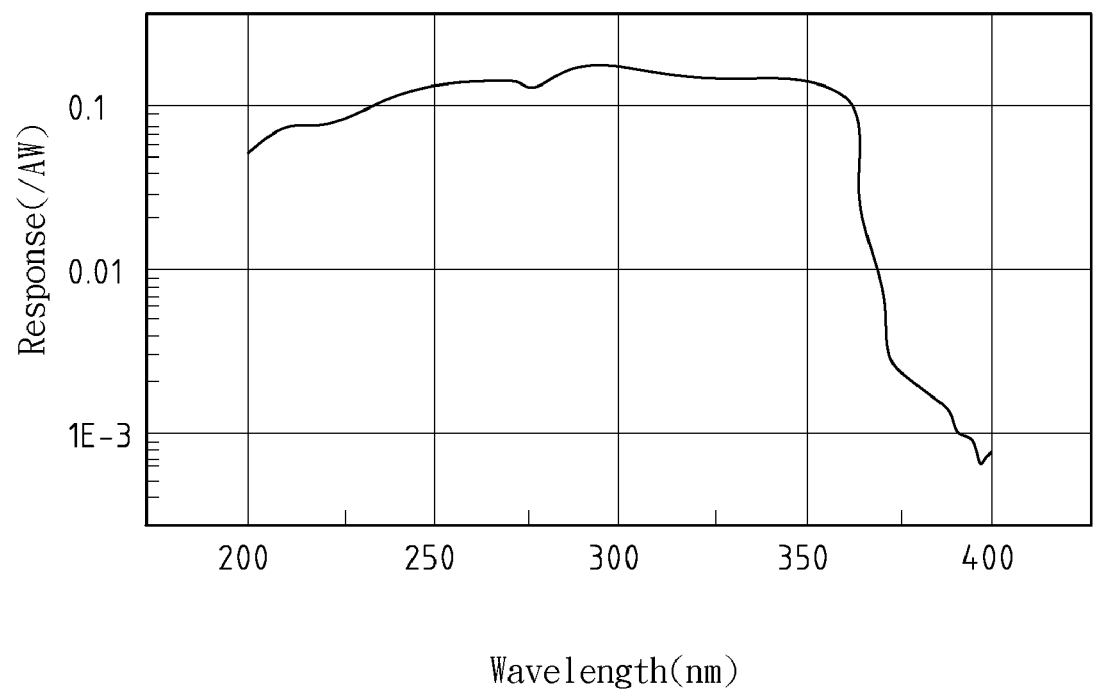
FIG. 1 is a response characteristics graph of a GaN-based UV photo detector.
Figure 2:
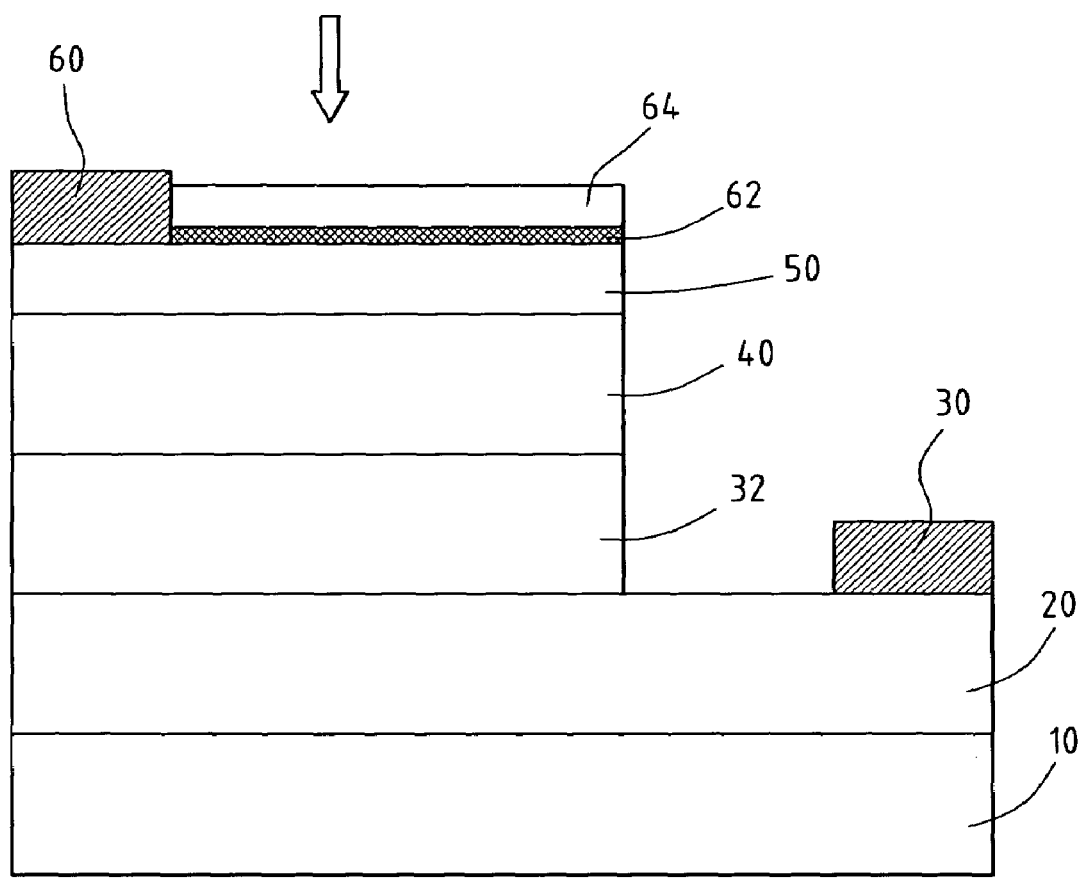
FIG. 2 is a schematic diagram showing the epitaxial structure of the GaN-based UV photo detector according to the first embodiment of the present invention.

FIG. 2 is a schematic diagram showing the epitaxial structure of the GaN-based UV photo detector according to the first embodiment of the present invention. As shown in FIG. 2, the GaN-based UV photo detector has a substrate 10 made of C-plane, R-plane, or A-plane aluminum-oxide monocrystalline (sapphire), or an oxide monocrystalline having a lattice constant compatible with that of nitride semiconductors. The substrate 10 can also be made of SiC (6H—SiC or 4H—SiC), Si, ZnO, GaAs, or $MgAl_2O_4$.

Generally, the most common material used for the substrate 10 is sapphire or SiC. An n-type contact layer 20 made of n-type doped $Al_aGa_bIn_{1-a-b}N$ ($0 \leq a,b \leq 1$, $a+b \leq 1$) having a specific composition is then formed on an upper side of the substrate 10. The n-type contact layer 20 has a thickness between 3000 Å and 40000 Å and a growing temperature between 700° C. and 1200° C. Then, a light absorption layer 32 made of undoped $Al_cGa_dIn_{1-c-d}N$ ($0 \leq c,d \leq 1$, $c+d \leq 1$) having a specific composition is grown on the n-type contact layer 20's upper surface. The light absorption layer 32 has a thickness between 100 Å and 10000 Å and a growing temperature between 700° C. and 1200° C. By appropriately controlling the composition of the Al, Ga, and In, the light absorption layer 32 has a band gap larger than 3.4 eV and, therefore, can sharply detect lights in the UV band (300 nm$\leq \lambda \leq$370 nm). A negative electrode 30 made of Ti/Al alloy, on the other hand, is deposited on a part of the n-type contact layer 20's upper surface.

On top of the light absorption layer 32, the light penetration layer 40 has a superlattice structure comprising multiple ($\geq 2$) intermediate layers. Each intermediate layer further comprises two base layers made of p-type doped $Al_eGa_fIn_{1-e-f}N$ and $Al_gGa_hIn_{1-g-h}N$ ($0 \leq e,f,g,h \leq 1$, $e+f \leq 1$, $g+h \leq 1$) respectively, each having a specific composition, a thickness between 50 Å and 200 Å, and a growing temperature between 700° C. and 1200° C., all independent of other base layers. As a superlattice structure has high carrier density and carrier mobility, the GaN-based UV photo detector therefore has rather superior electrical characteristics. The light penetration layer has a band gap wider than that of the light absorption layer.

Then, on top of the light penetration layer 40, there is a p-type contact layer 50 made of p-type doped $Al_iGa_jIn_{1-i-j}N$ ($0 \leq i,j \leq 1$, $i+j \leq 1$) having a specific composition and a growing temperature between 700° C. and 1200° C. As the p-type contact layer 50 cannot have a band gap too wide to form ohmic contact with the positive electrode 60 above and too narrow to cause light absorption problem, the p-type contact layer 50 has a thickness between 20 Å and 2000 Å, Then, on top of the p-type contact layer 50, there are a positive electrode 60 and a light penetration contact layer 62, which are not overlapping with each other. The positive electrode 60 is made of a Ni/Au alloy. The light penetration contact layer 62 can be a metallic conductive layer having a thickness between 20 Å and 200 Å, or a transparent oxide layer having a thickness between 200 Å and 3000 Å. The metallic conductive layer is made of one of the materials including Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$, ($x \geq 0$), $WSi_y$ ($y \geq 0$), and other similar materials. The transparent oxide layer, on the other hand, is made of one of the materials including ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$, and other similar materials.

On top of the light penetration contact layer 62, an anti-reflective coating layer 64 not overlapping the positive electrode 60 is formed to avoid the incident UV lights being reflected by the GaN-based UV photo detector. The anti-reflective coating layer 64 is made of one of the materials including $SiO_2$, $SiN_4$, and $TiO_2$. The anti-reflective coating layer 64 can also be a Distributed Bragg Reflector (DBR) made of $SiO_2/TiO_2$. The anti-reflective coating layer 64 has a reflectivity less than 30% for lights having wavelengths in the UV band.

Figure 3:
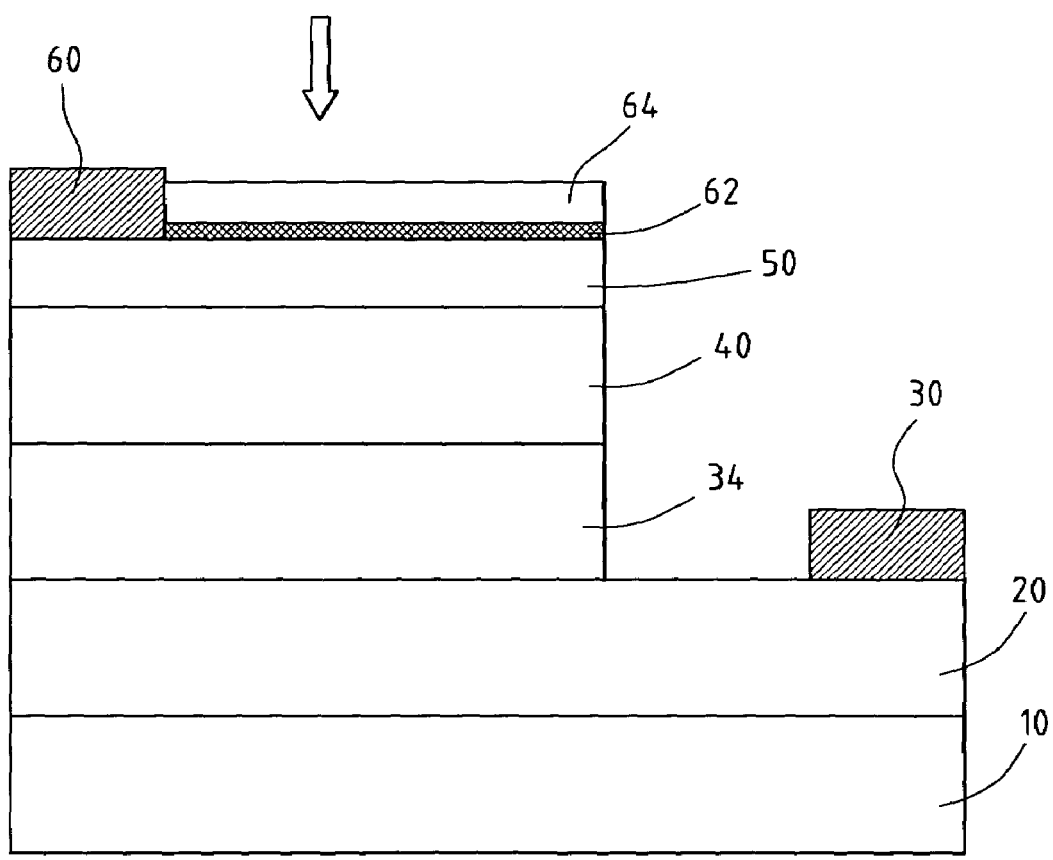
FIG. 3 is a schematic diagram showing the epitaxial structure of the GaN-based UV photo detector according to the second embodiment of the present invention.

FIG. 3 is a schematic diagram showing the epitaxial structure of the GaN-based UV photo detector according to the second embodiment of the present invention. As shown in FIG. 3, the present embodiment has an identical structure as in the previous embodiment. The only difference lies in the material used for the light absorption layer. Within this embodiment, the light absorption layer 34 is made of In-doped $Al_mGa_{1-m}N$ ($0 \leq m \leq 1$) having a specific composition. As the In-doped nitrides have smooth-faced characteristics, the present embodiment has an even better epitaxial quality, in addition to the advantages also available in the first embodiment of the present invention.

Figure 4:
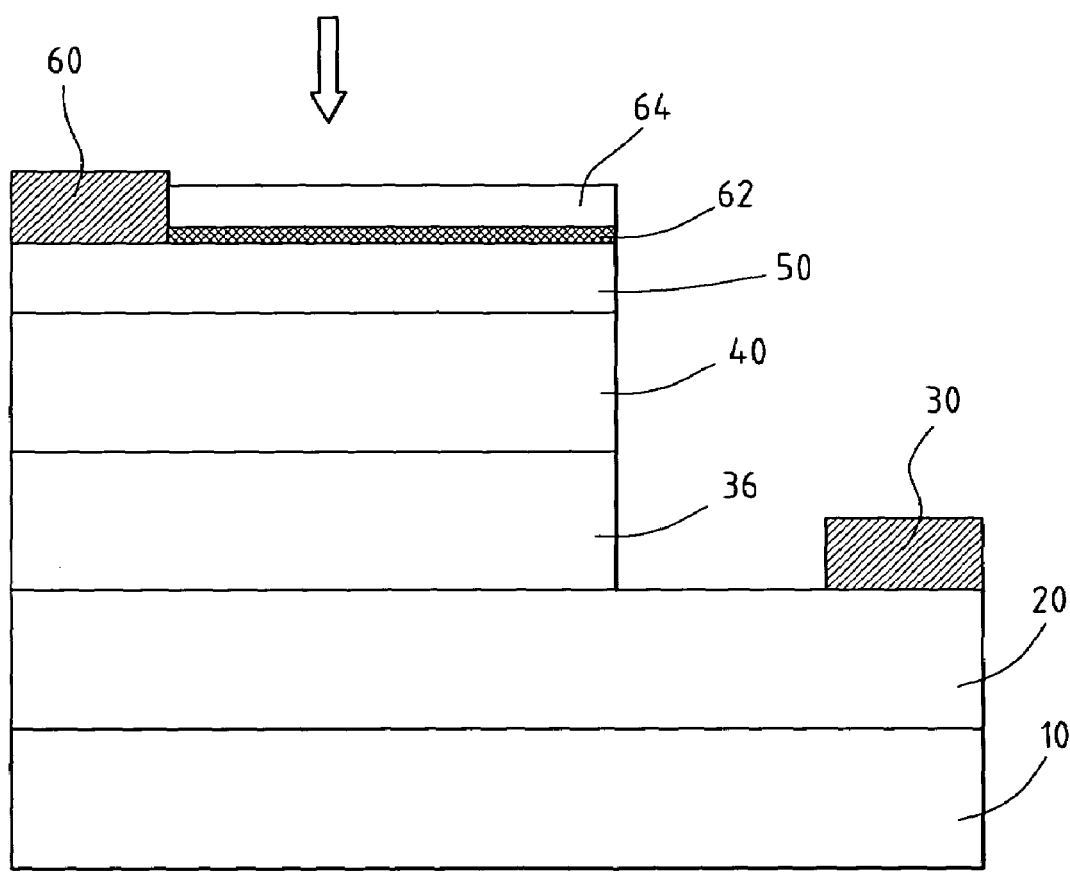
FIG. 4 is a schematic diagram showing the epitaxial structure of the GaN-based UV photo detector according to the third embodiment of the present invention.

FIG. 4 is a schematic diagram showing the epitaxial structure of the GaN-based UV photo detector according to the third embodiment of the present invention. As shown in FIG. 4, the present embodiment has an identical structure as in the previous embodiments. The only difference lies in the material used and the structure of the light absorption layer. Within the present embodiment, the light absorption layer 36 has a superlattice structure comprising multiple ($\geq 2$) intermediate layers. Each intermediate layer comprises two base layers made of undoped $Al_pGa_qIn_{1-p-q}N$ and $Al_rGa_sIn_{1-r-s}N$ ($0 \leq p,q,r,s \leq 1$, $p+q \leq 1$, $r+s \leq 1$) respectively. Each of the base layers has a specific composition, a thickness between 50 Å and 200 Å, and a growing temperature between 700° C. and 1200° C., all independent of other base layers. The light absorption layer 36 has a total thickness between 100 Å and 10000 Å. The superlattice structure of the present embodiment avoids the cracking problem of a single-layered thick film having a high content of aluminum nitrides as seen in the previous embodiments. On the other hand, the present embodiment's superlattice structure having a high content of aluminum nitrides can achieve an even wider band gap, so as to respond sharply to UV lights with even shorter wavelengths ($\lambda \approx 300$ nm).

Figure 5:
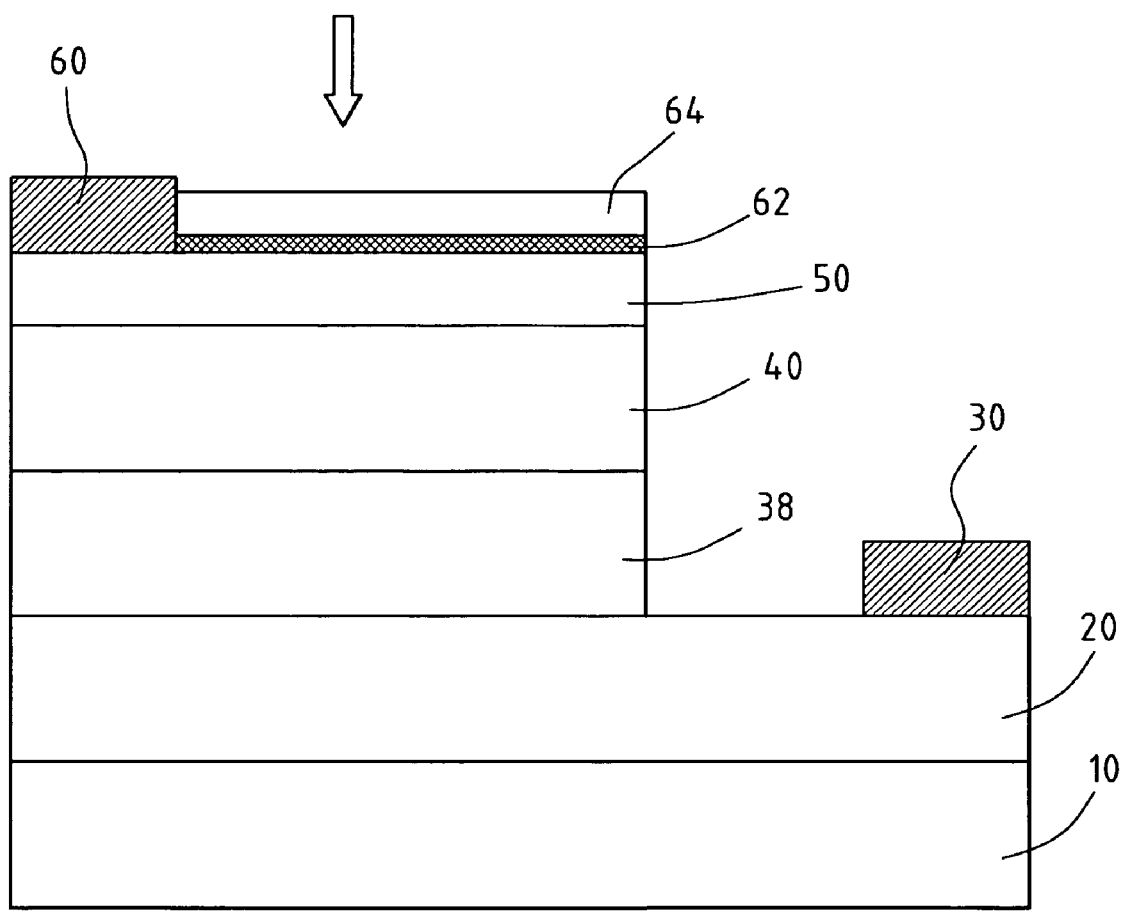
FIG. 5 is a schematic diagram showing the epitaxial structure of the GaN-based UV photo detector according to the fourth embodiment of the present invention.

FIG. 5 is a schematic diagram showing the epitaxial structure of the GaN-based UV photo detector according to the fourth embodiment of the present invention. As shown in FIG. 5, the present embodiment has an identical structure as in the previous third embodiment. The only difference lies in the material used for the light absorption layer. Within the present embodiment, the light absorption layer 38 has a superlattice structure comprising multiple ($\geq 2$) intermediate layers. Each intermediate layer comprises two base layers made of In-doped $Al_uGa_{1-u}N$ and $Al_wGa_{1-w}N$ ($0 \leq u,w \leq 1$) respectively. Each of the base layers has a specific composition, a thickness between 50 Å and 200 Å, and a growing temperature between 700° C. and 1200° C., all independent of other base layers. The light absorption layer 38 has a total thickness between 100 Å and 10000 Å. The superlattice structure of the present embodiment avoids the cracking problem of a single-layered thick film having a high content of aluminum nitrides as seen in the previous embodiments. On the other hand, the present embodiment's superlattice structure having a high content of aluminum nitrides can achieve an even wider band gap, so as to respond sharply to UV lights with even shorter wavelengths ($\lambda \approx 300$ nm). In addition, as the In-doped nitrides have smooth-faced characteristics, this fourth embodiment of the presentation has an even better epitaxial quality.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN-based UV photo detector structure, comprising:
a substrate made of a material selected from the group consisting of sapphire, 6H—SiC, 4H—SiC, Si, ZnO, GaAs, $MgAl_2O_4$, and an oxide monocrystalline having a lattice constant compatible with those of nitride semiconductors;
an n-type contact layer having a thickness between 3000 Å and 40000 Å made of n-type doped $Al_aGa_bIn_{1-a-b}N$ ($0 \leq a,b \leq 1$, $a+b \leq 1$) having a specific composition located on top of an upper side of said substrate;
a light absorption layer having a thickness between 100 Å and 10000 Å made of undoped $Al_cGa_dIn_{1-c-d}N$ ($0 \leq c, d \leq 1$, $c+d \leq 1$) having a band gap greater than 3.4 eV located on top of said n-type contact layer's upper surface;
a negative electrode made of Ti/Al alloy located on top of a part of said n-type contact layer's upper surface;
a light penetration layer having a wider band gap than that of said light absorption layer located on top of said light absorption layer comprising a superlattice structure formed by stacking a plurality of intermediate layers, each of said intermediate layers further comprising two base layers made of p-type doped $Al_eGa_fIn_{1-e-f}N$ and $Al_gGa_hIn_{1-g-h}N$ ($0 \leq e,f,g,h \leq 1$, $e+f \leq 1$, $g+h \leq 1$) respectively, and each of said base layers having a specific composition and a thickness between 50 Å and 200 Å, both independent of other base layers;
a p-type contact layer having a thickness between 20 Å and 2000 Å made of p-type doped $Al_iGa_jIn_{1-i-j}N$ ($0 \leq i,j \leq 1$, $i+j \leq 1$) having a specific composition located on top of said light penetration layer;
a light penetration contact layer being one selected from the group consisting of a metallic conductive layer having a thickness between 20 Å and 200 Å, and a transparent oxide layer having a thickness between 200 Å and 3000 Å, located on top of a part of said p-type contact layer's upper surface;
a positive electrode made of Ni/Au alloy located on top of another part of said p-type contact layer's upper surface not covered by said light penetration contact layer; and
an anti-reflective coating layer made of one selected from the group consisting of $SiO_2$, $SiN_4$, $TiO_2$, and a Distributed Bragg Reflector made of $SiO_2/TiO_2$ located on top of said light penetration contact layer.

2. The GaN-based UV photo detector structure as claimed in claim 1, wherein said light absorption layer is made of undoped $Al_cGa_dIn_{1-c-d}N$ ($0 \leq c,d \leq 1$, $c+d \leq 1$) having a specific composition.

3. The GaN-based UV photo detector structure as claimed in claim 1, wherein said light absorption layer is made of In-doped $Al_mGa_{1-m}N$ ($0 \leq m \leq 1$) having a specific composition.

4. The GaN-based UV photo detector structure as claimed in claim 1, wherein said light absorption layer has a superlattice structure comprising a plurality of intermediate layers, each of said intermediate layers comprises two base layers made of undoped $Al_pGa_qIn_{1-p-q}N$ and $Al_rGa_sIn_{1-r-s}N$ ($0 \leq p,q,r,s \leq 1$, $p+q \leq 1$, $r+s \leq 1$) respectively, and each of said base layers has a specific composition and a thickness between 50 Å and 200 Å, both independent of other base layers.

5. The GaN-based UV photo detector structure as claimed in claim 1, wherein said light absorption layer has a superlattice structure comprising a plurality of intermediate layers, each of said intermediate layers comprises two base layers made of In-doped $Al_uGa_{1-u}N$ and $Al_wGa_{1-w}N$ ($0 \leq u, w \leq 1$) respectively, and each of said base layers has a specific composition and a thickness between 50 Å and 200 Å, both independent of other base layers.

6. The GaN-based UV photo detector structure as claimed in claim 1, wherein said metallic conductive layer is made of a material selected from the group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x \geq 0$), and $WSi_y$ ($y \geq 0$).

7. The GaN-based UV photo detector structure as claimed in claim 1, wherein said transparent oxide layer is made of a material selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

* * * * *